United States Patent
Mahnkopf et al.

(10) Patent No.: US 9,564,400 B2
(45) Date of Patent: Feb. 7, 2017

(54) METHODS OF FORMING STACKED MICROELECTRONIC DICE EMBEDDED IN A MICROELECTRONIC SUBSTRATE

(71) Applicant: Intel Corporation, Santa Clara, CA (US)

(72) Inventors: Reinhard Mahnkopf, Oberhaching (DE); Wolfgang Molzer, Ottobrunn (DE); Bernd Memmler, Riemerling (DE); Edmund Goetz, Dachau (DE); Hans-Joachim Barth, Munich (DE); Sven Albers, Regensburg (DE); Thorsten Meyer, Regensburg (DE)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/009,731

(22) Filed: Jan. 28, 2016

(65) Prior Publication Data

US 2016/0148920 A1    May 26, 2016

Related U.S. Application Data

(62) Division of application No. 14/034,854, filed on Sep. 24, 2013, now Pat. No. 9,373,588.

(51) Int. Cl.
*H01L 21/44* (2006.01)
*H01L 23/538* (2006.01)
(Continued)

(52) U.S. Cl.
CPC ......... *H01L 23/5389* (2013.01); *H01L 21/563* (2013.01); *H01L 21/76898* (2013.01);
(Continued)

(58) Field of Classification Search
CPC .............. H01L 2924/00; H01L 2924/00014; H01L 2224/32225; H01L 2224/73265; H01L 2924/00012
(Continued)

(56) References Cited

U.S. PATENT DOCUMENTS 6,768,209 B1    7/2004   Jiang et al.
6,820,329 B2   11/2004   Fang
(Continued)

FOREIGN PATENT DOCUMENTS

CN    1498417 A      5/2004
CN   101542726 A     9/2009
(Continued)

OTHER PUBLICATIONS

Office Action and Search Report Received for Chinese Patent Application No. 201410492487.X, mailed on Oct. 9, 2016, 15 pages of Chinese Office Action including 9 pages of English Translation. X.

*Primary Examiner* — Andy Huynh
(74) *Attorney, Agent, or Firm* — Winkle, PLLC

(57) ABSTRACT

Embodiments of the present description include stacked microelectronic dice embedded in a microelectronic substrate and methods of fabricating the same. In one embodiment, at least one first microelectronic die is attached to a second microelectronic die, wherein an underfill material is provided between the second microelectronic die and the at least one first microelectronic die. The microelectronic substrate is then formed by laminating the first microelectronic die and the second microelectronic die in a substrate material.

19 Claims, 7 Drawing Sheets

(51) Int. Cl.
*H01L 21/768* (2006.01)
*H01L 23/522* (2006.01)
*H01L 23/00* (2006.01)
*H01L 25/07* (2006.01)
*H01L 25/00* (2006.01)
*H01L 25/065* (2006.01)
*H01L 23/31* (2006.01)
*H01L 21/56* (2006.01)

(52) U.S. Cl.
CPC ...... *H01L 23/5226* (2013.01); *H01L 23/5384* (2013.01); *H01L 23/562* (2013.01); *H01L 24/03* (2013.01); *H01L 24/81* (2013.01); *H01L 25/0657* (2013.01); *H01L 25/074* (2013.01); *H01L 25/50* (2013.01); *H01L 21/56* (2013.01); *H01L 23/3121* (2013.01); *H01L 2224/08146* (2013.01); *H01L 2224/16148* (2013.01); *H01L 2224/73204* (2013.01); *H01L 2225/06513* (2013.01); *H01L 2225/06541* (2013.01); *H01L 2225/06544* (2013.01); *H01L 2225/06548* (2013.01); *H01L 2225/06568* (2013.01)

(58) Field of Classification Search
USPC .......................................................... 438/108
See application file for complete search history.

(56) References Cited

U.S. PATENT DOCUMENTS

| | | | | |
|---|---|---|---|---|
| 6,853,087 | B2 * | 2/2005 | Neuhaus | H05K 3/325 257/700 |
| 7,217,595 | B2 * | 5/2007 | Morrow | H01L 21/563 257/686 |
| 8,970,023 | B2 * | 3/2015 | Chou | H01L 24/11 257/685 |
| 2003/0110625 | A1 | 6/2003 | Fang | |
| 2005/0189632 | A1 | 9/2005 | Morrow et al. | |
| 2012/0049364 | A1 | 3/2012 | Sutardja et al. | |
| 2014/0312511 | A1 | 10/2014 | Nakamura et al. | |

FOREIGN PATENT DOCUMENTS

| | | |
|---|---|---|
| CN | 102263084 A | 11/2011 |
| CN | 102272916 A | 12/2011 |

* cited by examiner

METHODS OF FORMING STACKED MICROELECTRONIC DICE EMBEDDED IN A MICROELECTRONIC SUBSTRATE

CROSS REFERENCE TO RELATED APPLICATIONS

The present application is a a divisional of U.S. patent application Ser. No. 14/034,854, filed Sep. 24, 2013.

TECHNICAL FIELD

Embodiments described herein generally related to microelectronic devices that include stacked microelectronic dice embedded within a microelectronic substrate.

BACKGROUND

Higher performance, lower cost, increased miniaturization of integrated circuit components, and greater packaging density of integrated circuits are ongoing goals of the microelectronic industry. One method to achieve at least some of these goals is to stack the microelectronic dice. These stacked microelectronic dice may then be mounted on a microelectronic substrate that provides electrical communication routes between the microelectronic dice and external components. However, the stacked microelectronic dice may result in a z-height (e.g. thickness) that is too great for use in thin form factor devices, such as cellular phones, tablets, and the like. Thus, the stacked microelectronic dice may be embedded within the microelectronic substrate by a lamination process to reduce the z-height. However, microelectronic dice are relatively fragile and in a stacked configuration may be susceptible to cracking during the lamination process.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1:
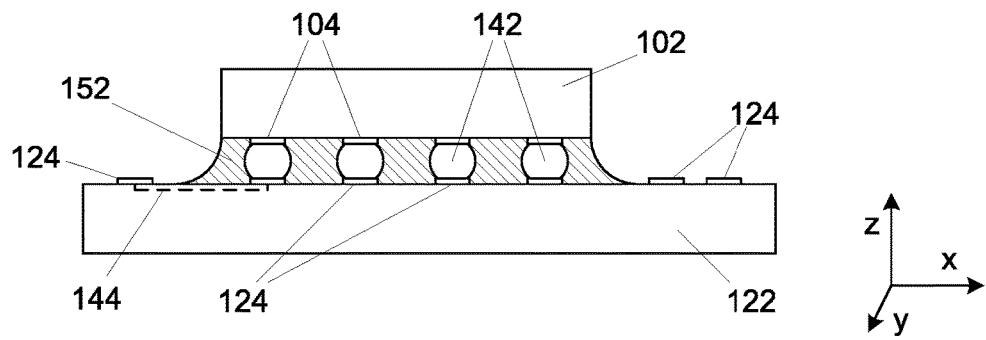
FIGS. 1-5 illustrate side cross-sectional views of methods for forming a microelectronic substrate having stacked microelectronic die embedded therein, according to embodiments of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

Embodiments of the present description relate to the field of embedding stacked microelectronic dice in a microelectronic substrate. In one embodiment, at least one first microelectronic die may be attached to a second microelectronic die, wherein an underfill material is provided between the at least one first microelectronic die and the second microelectronic die. A microelectronic substrate may then be formed by laminating the at least one first microelectronic die and the second microelectronic in a substrate material.

In one embodiment, as shown in FIG. 1, at least one first microelectronic die 102 may be attached to a second microelectronic die 122 through a plurality of interconnects 142, such as reflowable solder bumps or balls, in a configuration generally known as a flip-chip or controlled collapse chip connection ("C4") configuration. The interconnects 142 may extend between bond pads 104 on the first microelectronic die 102 and mirror-image bond pads 124 on the second microelectronic die 122 to form an electrical connection therebetween. The first microelectronic die bond pads 104 may be in electrical communication with integrated circuitry (not shown) within the first microelectronic die 102. The second microelectronic die bond pads 124 may be in electrical communication with integrated circuitry (not shown) within the second microelectronic die 122 and/or may be in electrical communication with conductive traces (shown as dashed lines 144), which are connected to second microelectronic die bond pads 124 that do not form the attachment of the first microelectronic die 102 to the second microelectronic die 122. Although FIG. 1 illustrates that the first microelectronic die 102 is smaller, either in length (x-direction) and/or in width (y-direction), than the second microelectronic die 122, it is understood that the first microelectronic die 102 may be substantially the same size as the second microelectronic die 104. Additionally, more than one first microelectronic die 102 may be attached to the second microelectronic die 122, and more than two microelectronic dice may be stacked upon one another.

Both the first microelectronic die 102 and the second microelectronic die 122 may be any appropriate microelectronic component, including active components such as a microprocessor, a chipset, a graphics device, a wireless device, a memory device, an application specific integrated circuit, or the like, and one of the first microelectronic die 102 and the second microelectronic die 122 may be a passive component, such as a resistor, capacitor, inductor, and the like.

The interconnects 142 may be made any appropriate material, including, but not limited to, solders and conductive filled epoxies. Solder materials may include may be any appropriate material, including but not limited to, lead/tin alloys, such as 63% tin/37% lead solder, or lead-free solders, such a pure tin or high tin content alloys (e.g. 90% or more tin), such as tin/bismuth, eutectic tin/silver, ternary tin/silver/copper, eutectic tin/copper, and similar alloys. When the first microelectronic die 102 is attached to the second microelectronic die 122 with interconnects 142 made of solder, the solder is reflowed, either by heat, pressure, and/or sonic energy to secure the solder between the first microelectronic die bond pads 104 and the second microelectronic bond pads 124.

Figure 2:
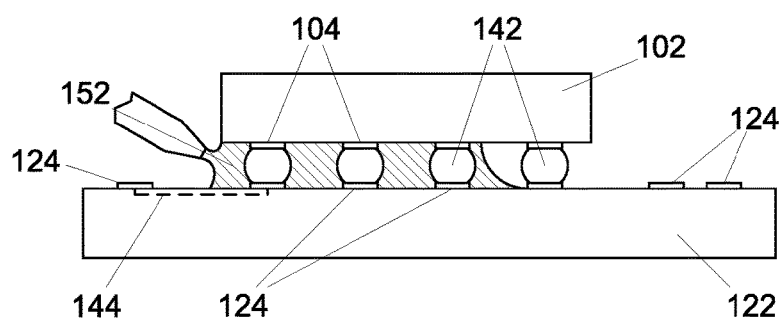

As further shown in FIG. 1, an electrically-insulating underfill material 152 may be disposed between the first microelectronic die 102 and the second microelectronic die 122, and around the interconnects 142. In one embodiment, as shown in FIG. 2, the underfill material 152 may be a polymer material, such as an epoxy resin material that may include a filler material (such as silicon dioxide), that has sufficiently low viscosity to be wicked between the first microelectronic die 102 and the second microelectronic die 104 by capillary action when introduced by a dispenser 154 along the first microelectronic die 102, after the attachment of the first microelectronic die 102 to the second microelectronic die 122, which will be understood to those skilled in the art, to form the configuration shown in FIG. 1. The underfill material 152 may then be subsequently cured (hardened). As will be understood to those skilled in the art, the underfill material 152 may have a coefficient of thermal expansion which is substantially the same as the coefficient of thermal expansion of the first microelectronic die 102 and the second microelectronic die 122.

Figure 3:
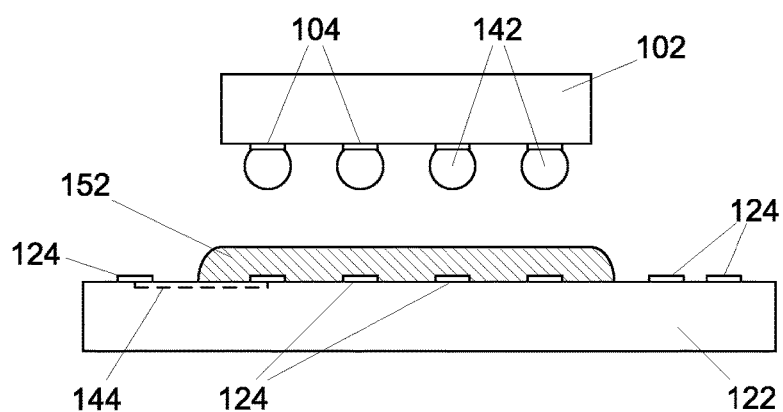

In another embodiment, as shown in FIG. 3, the underfill material 152 may be a "no-flow" underfill material applied to either the first microelectronic die 102, the second microelectronic die 122 (shown), or both, prior the attachment of the first microelectronic die 102 to the second microelectronic die 122. In general, a no-flow underfill material 152 has a viscosity with allows it to be applied, such as by printing or laminate, and substantially retain its shape, as will be understood to those skilled in the art. The interconnects 142 may be pressed through the "no-flow" underfill material 152 during the attachment of the first microelectronic die 102 to the second microelectronic die 122 to form the configuration shown in FIG. 1. The underfill material 152 may then be subsequently cured (hardened).

Figure 4:
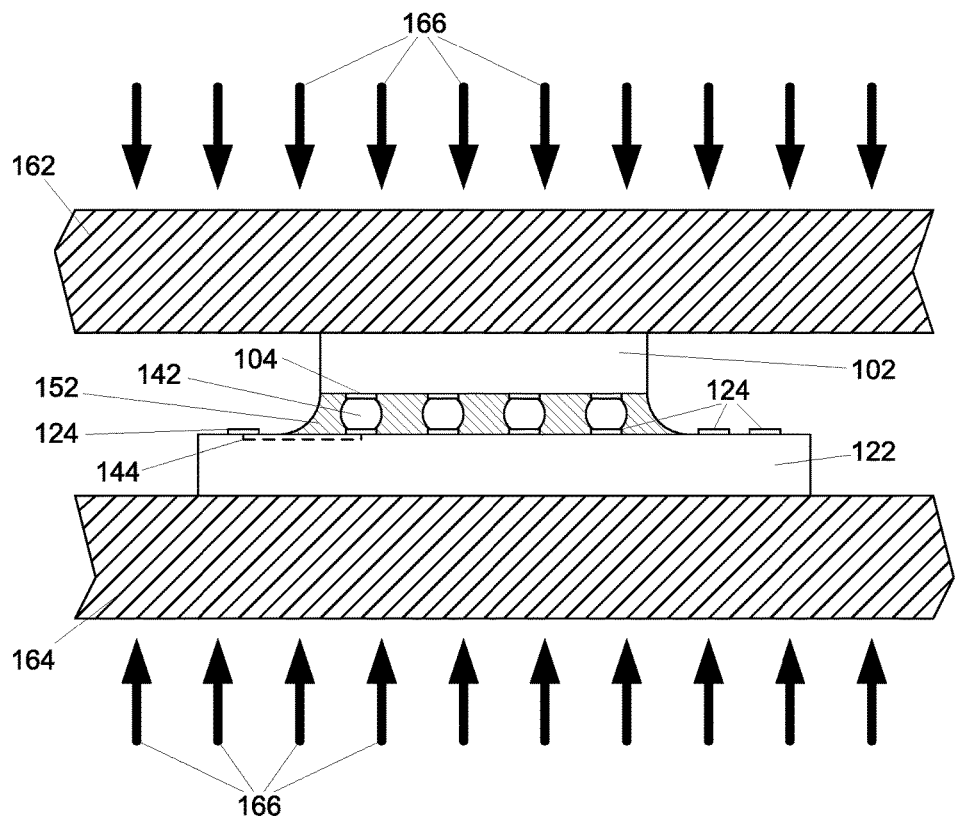
Figure 5:
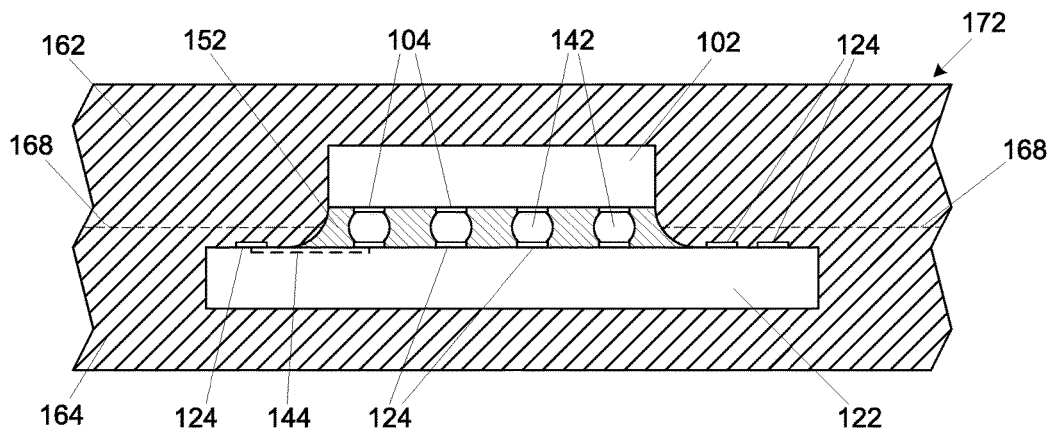

As shown in FIG. 4, an electrically insulative first laminate layer 162 may be positioned proximate the first microelectronic die 102 and an electrically insulative second laminate layer 164 may be positioned proximate the second microelectronic die 122. Pressure (shown as arrows 166 in FIG. 4) may be brought to bear on the first laminate layer 162 and the second laminate layer 164 to push the first laminate layer 162 and the second laminate layer 164 toward one another, thereby forming the microelectronic substrate 172 which embeds (e.g. substantially surrounds) the at least one first microelectronic die 102 and the second microelectronic die 122 therein, as shown in FIG. 5. The first laminate layer 162 and the second laminate layer 164 may be primarily composed of any appropriate substrate material, including, but not limited to polymers. The lamination process and material used are well known in the art, and, for the sake of brevity and conciseness, will not be described or illustrated herein. Furthermore, the first laminate layer 162 and the second laminate layer 164 may form an interface 168 therebetween. As shown in FIG. 5, the interface 168 may form abutting the underfill material 152. However, it is understood that the interface 168 may form abutting the first microelectronic die 102 or abutting the second microelectronic die 104 (not shown).

If the underfill material 152 were not present between the first microelectronic die 102 and the second microelectronic die 122, the pressure 166 brought to bear on the first laminate layer 162 and the second laminate layer 164 could result in at least one of the first microelectronic die 102 and the second microelectronic die 122 cracking.

Figure 6:
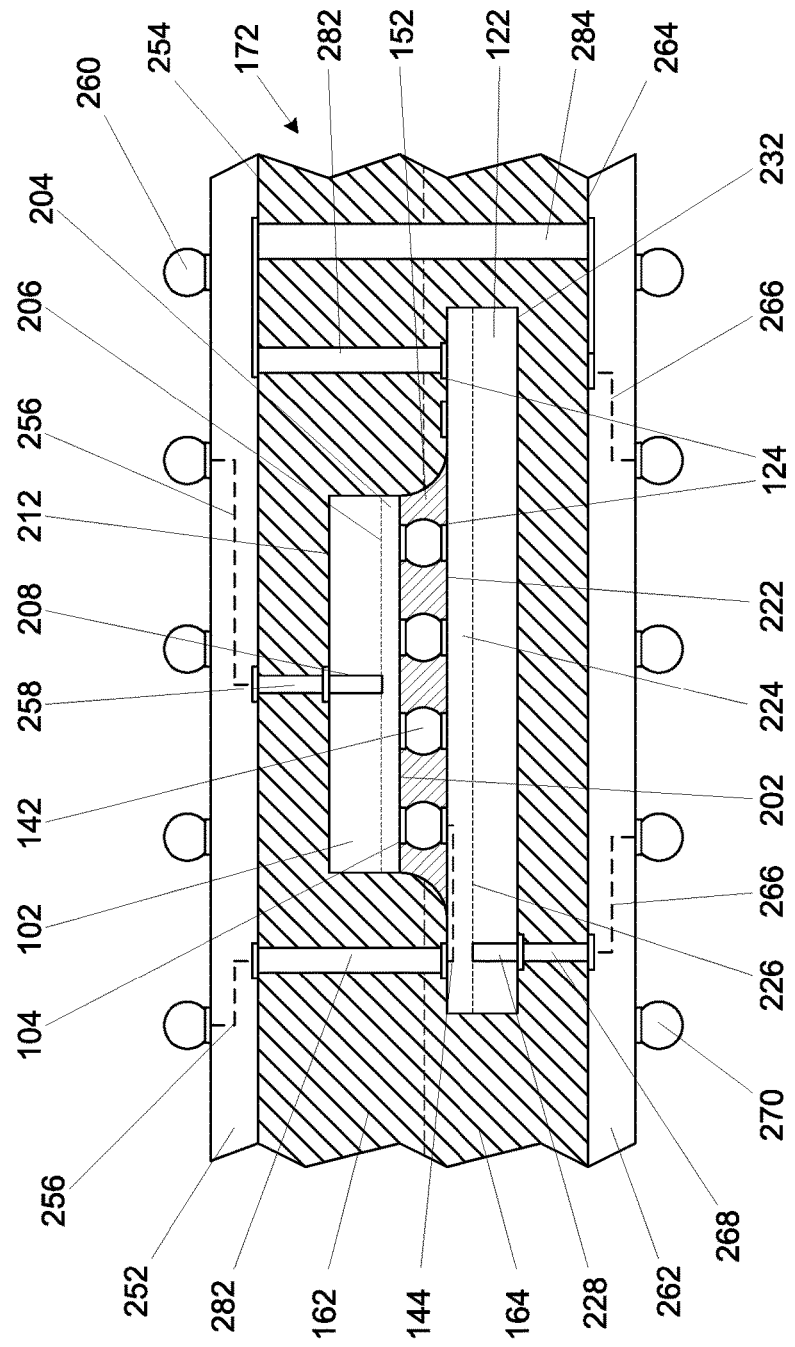
FIG. 6 illustrates a side cross-sectional view of a microelectronic device having stacked microelectronic die embedded within a microelectronic substrate, according to one embodiment of the present description.
Figure 7:
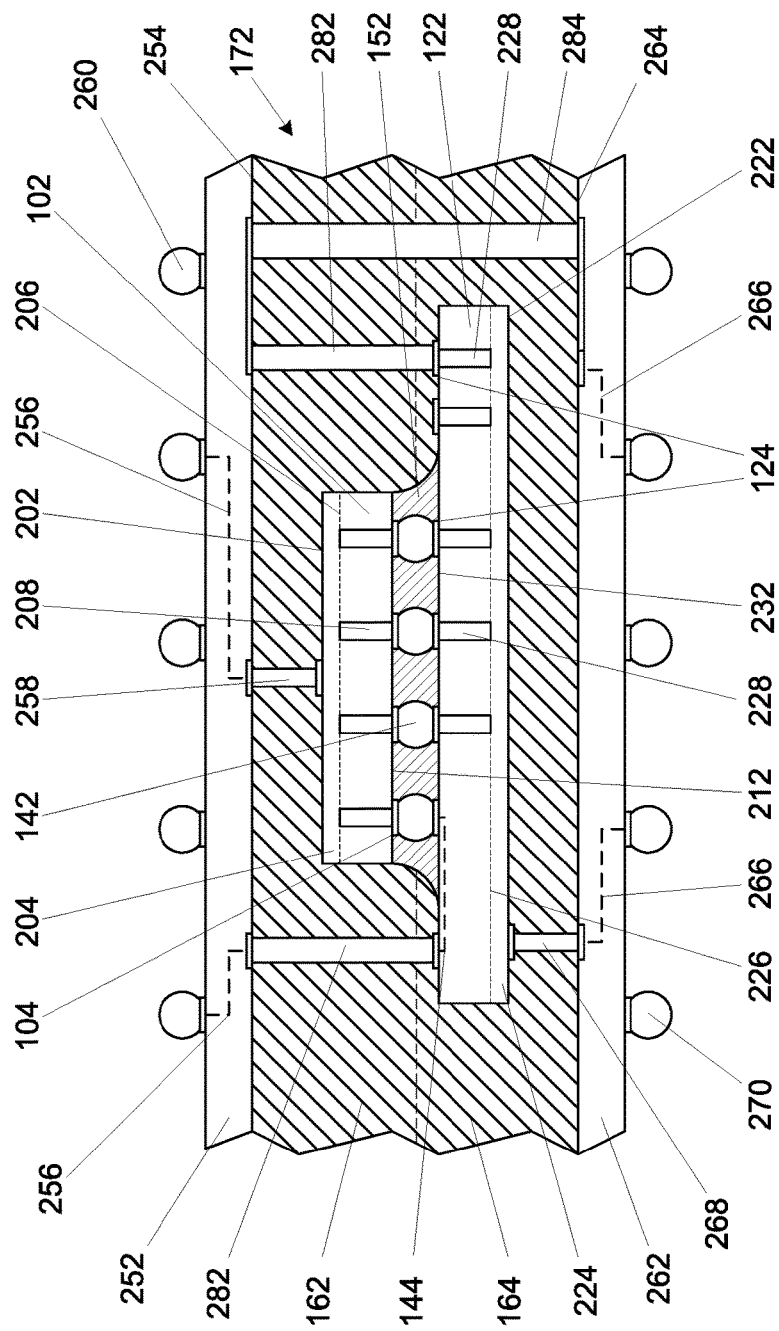
FIG. 7 illustrates a side cross-sectional view of a microelectronic device having stacked microelectronic die embedded within a microelectronic substrate, according to another embodiment of the present description.

FIGS. 6 and 7 illustrate two examples of electrical connections formed into the microelectronic substrate 172 to the first microelectronic die 102 and/or the second microelectronic die 122, thereby forming microelectronic devices. As shown in FIG. 6, the first microelectronic die bond pads 104 may be formed on an active surface 202 of the first microelectronic die 102. As is understood to those skilled in the art, the integrated circuits (not shown) of the first microelectronic die 102 are formed in an integrated circuit zone 204 between the first microelectronic die active surface 202 and a depth demarked by dotted line 206. Furthermore, the second microelectronic die bond pads 124 may be formed on an active surface 222 of the second microelectronic die 122. The integrated circuits (not shown) of the second microelectronic die 122 are formed in an integrated circuit zone 224 between the second microelectronic die active surface 222 and a depth demarked by dotted line 226. Thus, in the configuration illustrated in FIG. 6, the first microelectronic die active surface 202 faces the second microelectronic die active surface 222.

As further illustrated in FIG. 6, at least one through-silicon via 208 may be formed to extend from a back surface 212 of the first microelectronic die 102 (opposing the first microelectronic die active surface 202) to the first microelectronic die integrated circuit zone 204, such that the at least one first microelectronic die through-silicon via 208 may be in electrical contact with at least one integrated circuit (not shown) within the first microelectronic die integrated circuit zone 204. Additionally as illustrated in FIG. 6, at least one through-silicon via 228 may be formed to extend from a back surface 232 of the second microelectronic die 122 (opposing the second microelectronic die active surface 222) to the second microelectronic die integrated circuit zone 224, such that the at least one second microelectronic die through-silicon via 228 may be in electrical contact with at least one integrated circuit (not shown) within the second microelectronic die integrated circuit zone 224.

As shown in FIG. 6, a first interconnect layer 252 may be formed on a first surface 254 of the microelectronic substrate 172 (proximate the first microelectronic die 102) and/or a second interconnect layer 262 may be formed on a second surface 264 of the microelectronic substrate 172 (proximate the second microelectronic die 122). The first interconnect layer 252 and the second interconnect layer 262 may comprise a plurality of dielectric layers (not shown) with conductive routes (shown generically as dashed lines 256 and 266, respectively). The conductive routes 256 and 266 may be formed with conductive traces (not shown) formed between the conductive layers (not shown) with a plurality of conductive vias (not shown) extending through the dielectric layers (not shown). The first interconnect layer conductive route 256 may electrically couple at least one first microelectronic die through-silicon via 208 (through a first microelectronic die conductive via 258) with an external interconnect 260, such as solder balls (shown). Additionally, at least one conductive via 282 may extend from the substrate first surface 254 to a corresponding second microelectronic bond pad 124 that does not form the attachment of the first microelectronic die 102 to the second microelectronic die 122. The at least one conductive via 282 may be connected to at least one first interconnect layer conductive route 256. The second interconnect layer conductive route 266 may electrically couple at least one second microelectronic die through-silicon via 228 (through a second microelectronic die conductive via 268) with an external interconnect 270, such as solder balls (shown). Additionally, at least one through-substrate conductive via 284 may extend from the substrate first surface 254 to the substrate second surface 264. The through-substrate conductive via 284 may be connected to the conductive via 282 (shown), the second interconnect layer conductive route 266 (shown), the first interconnect layer conductive route 256 (not shown), the first microelectronic die through-silicon via 208 (not shown), and/or the second microelectronic die through-silicon via 228 (not shown). The processes and materials for forming such interconnect layers and electrical connectors are well known in the art, and, for the sake of brevity and conciseness, will not be described or illustrated herein.

FIG. 7 illustrates another embodiment of the present description, wherein the components are the same as illustrated in FIG. 6. However, as illustrated in FIG. 7, at least one of the first microelectronic die 102 and the second microelectronic die 122 is connected by its through-silicon via, i.e. element 208 and 228 respectively, to the other microelectronic die. FIG. 7 illustrates the first microelectronic die through-silicon vias 208 contacting respective first microelectronic die bond pads 104 and the second microelectronic die through-silicon vias 228 contacting respective second microelectronic die bond pads 124. Thus, the first interconnect layer conductive route 256 may electrically couple the first microelectronic die active surface 202 (through the first microelectronic die conductive via 258) with an external interconnect 260, such as solder balls (shown). The second interconnect layer conductive route 266 may electrically couple the second microelectronic die active surface 202 (through the second microelectronic die conductive via 268) with an external interconnect 270, such as solder balls (shown).

Figure 8:
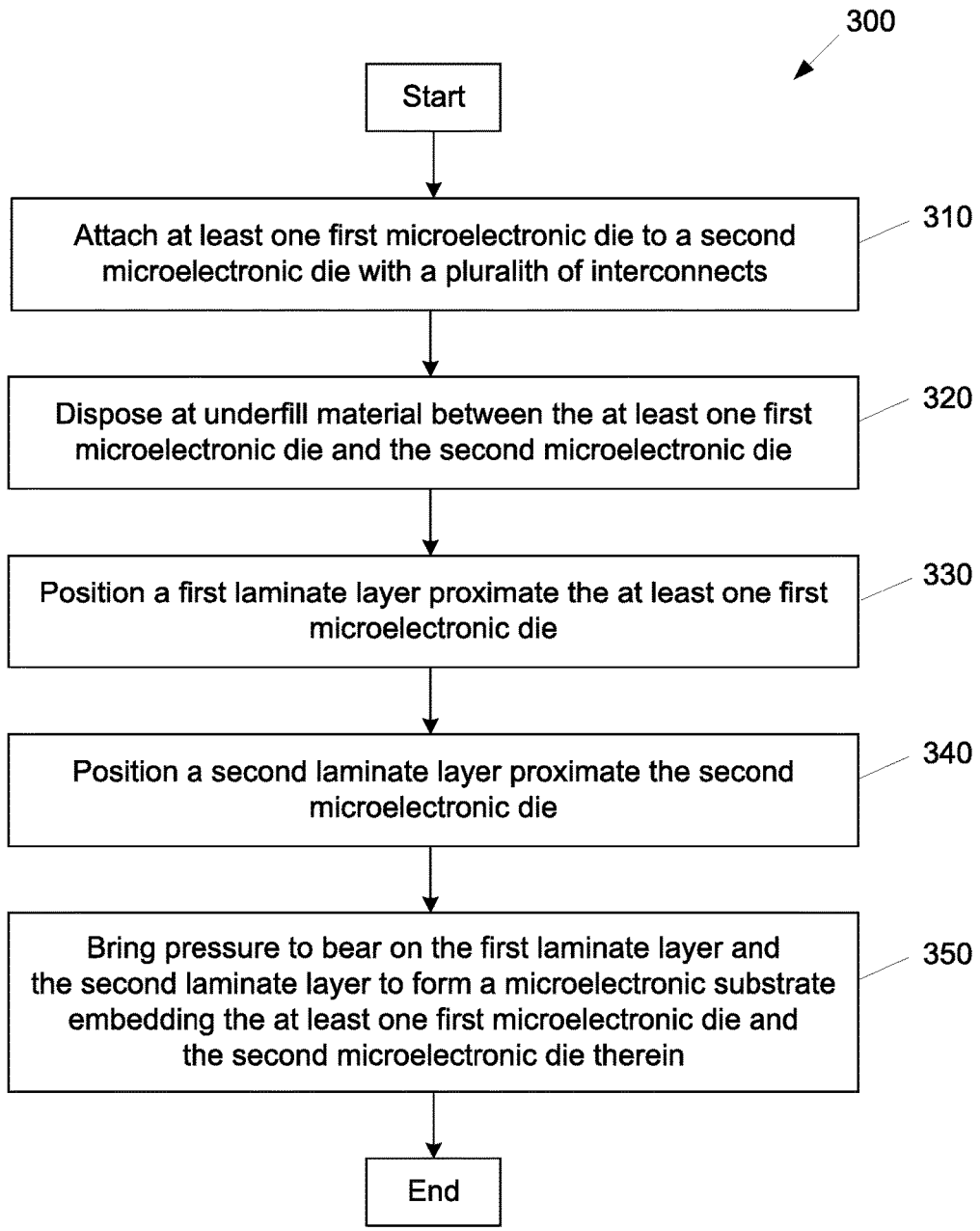
FIG. 8 is a flow chart of a process of forming a microelectronic substrate having stacked microelectronic die embedded therein, according to one embodiment of the present description.

FIG. 8 illustrates a process flow 300 of the present description. As represented in block 310, at least one first microelectronic die may be attached to a second microelectronic die through a plurality of interconnects. An underfill material may be disposed between the at least one first microelectronic die and the second microelectronic die, as represented in block 320. As represented in block 330, a first laminate layer may be positioned proximate the at least one first microelectronic die and, as represented in block 340, a second laminate layer may be positioned proximate the second microelectronic die. Pressure may be brought to bear on the first laminate layer and the second laminate layer to form a microelectronic substrate embedding the at least one microelectronic die and the second microelectronic die therein, as represented in block 350.

Figure 9:
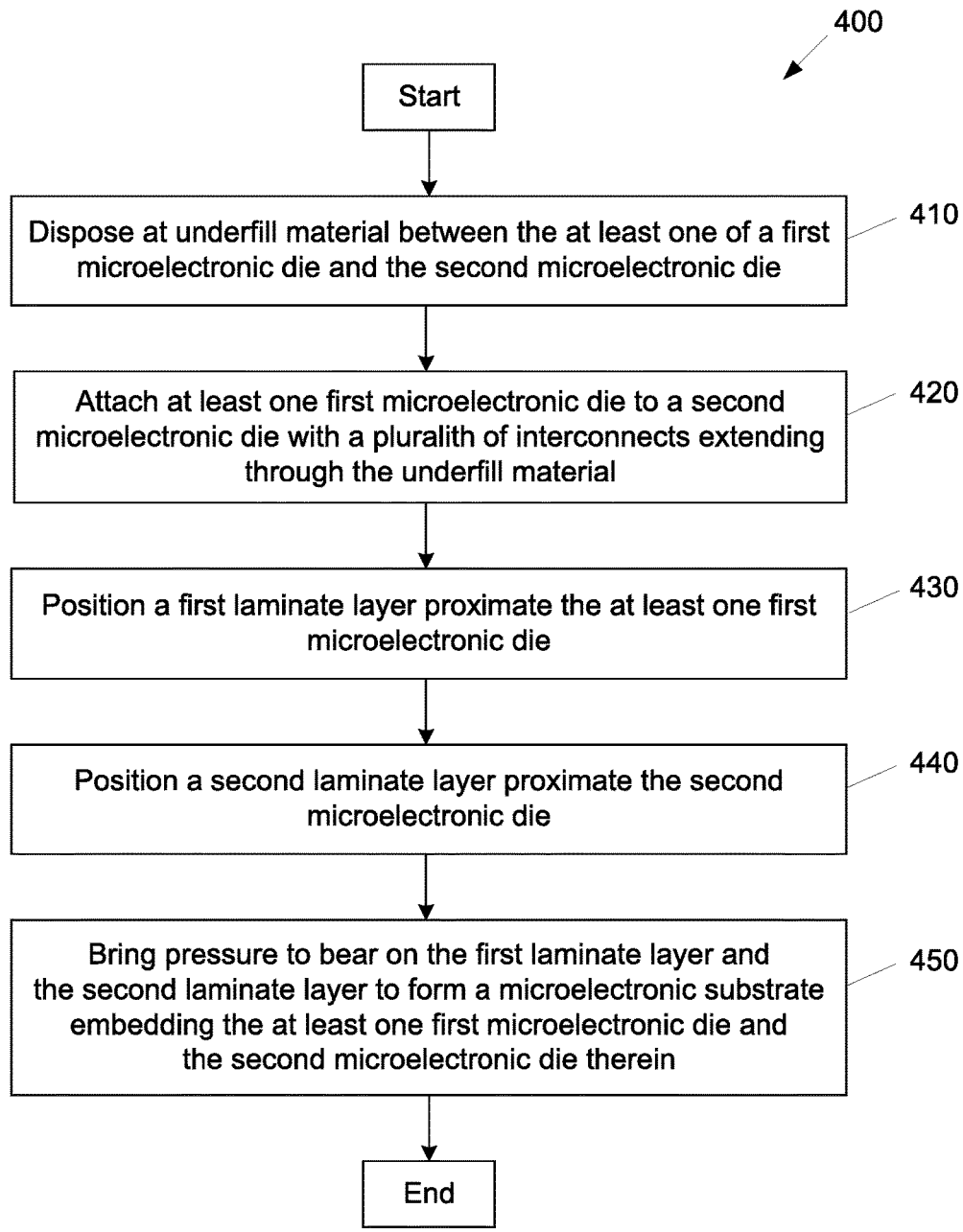
FIG. 9 is a flow chart of a process of forming a microelectronic substrate having stacked microelectronic die embedded therein, according to another embodiment of the present description.

FIG. 9 illustrates another process flow 400 of the present description. As represented in block 410, an underfill material may be disposed on the at least one of a first microelectronic die and the second microelectronic die. The at least first one microelectronic die may be attached to the second microelectronic die through a plurality of interconnects extending through the underfill material, as represented in block 420. As represented in block 430, a first laminate layer may be positioned proximate the at least one first microelectronic die and, as represented in block 440, a second laminate layer may be positioned proximate the second microelectronic die. Pressure may be brought to bear on the first laminate layer and the second laminate layer to form a microelectronic substrate embedding the at least one microelectronic die and the second microelectronic die therein, as represented in block 450.

Figure 10:
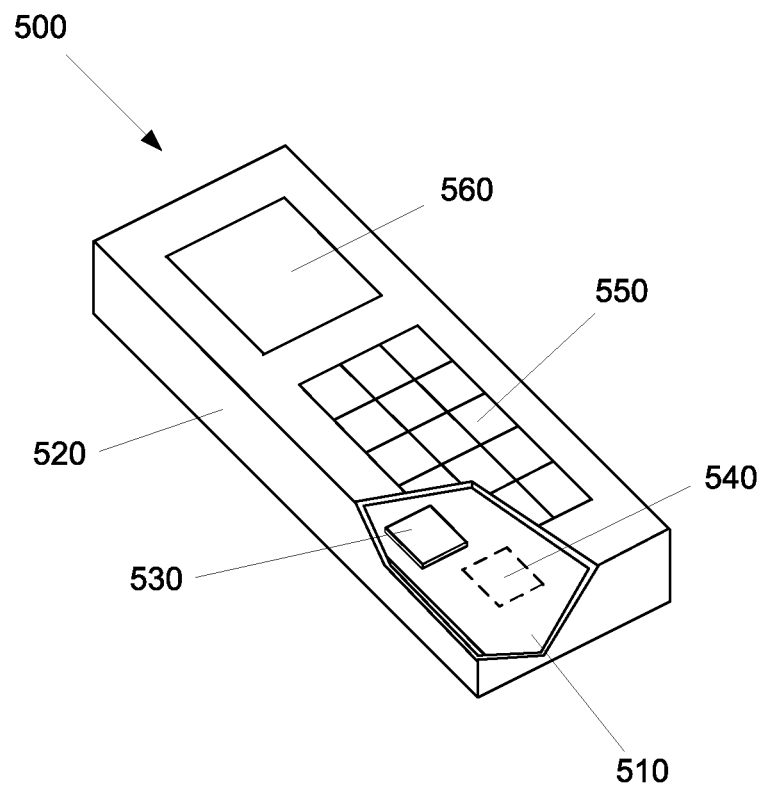
FIG. 10 illustrates an electronic system, according to one embodiment of the present description.

FIG. 10 illustrates an embodiment of an electronic system/device 500, such as a portable computer, a desktop computer, a mobile telephone, a digital camera, a digital music player, a web tablet/pad device, a personal digital assistant, a pager, an instant messaging device, or other devices. The electronic system/device 500 may be adapted to transmit and/or receive information wirelessly, such as through a wireless local area network (WLAN) system, a wireless personal area network (WPAN) system, and/or a cellular network. The electronic system/device 500 may include a microelectronic motherboard or substrate 510 disposed within a device housing 520. The microelectronic motherboard/substrate 510 may have various electronic components 530 electrically coupled thereto, including stacked microelectronic dice having an underfill material disposed therebetween (shown as dashed square 540) embedded therein, as described in the present description (see FIGS. 1-9). The microelectronic motherboard 510 may be attached to various peripheral devices including an input device 550, such as keypad, and a display device 560, such an LCD display. It is understood that the display device 560 may also function as the input device, if the display device 560 is touch sensitive.

The following examples pertain to further embodiments, wherein Example 1 is a microelectronic device, comprising at least one first microelectronic die; a second microelectronic die, wherein the at least one first microelectronic die is attached to the second microelectronic die with a plurality of interconnects; an underfill material disposed between the at least one first microelectronic die and the second microelectronic die; and wherein the at least one first microelectronic die and the second microelectronic die are embedded within a microelectronic substrate.

In Example 2, the subject matter of Example 1 can optionally include an active surface at least one of the first microelectronic die and the second microelectronic die being attached to the other of the first microelectronic die and the second microelectronic die with the plurality of interconnects.

In Example 3, the subject matter of any of Examples 1 and 2 can optionally include at least one of the first microelectronic die and the second microelectronic die including at least one through-silicon via.

In Example 4, the subject matter of Example 3 can optionally include at least one through silicon via at a back surface at least one of the first microelectronic die and the second microelectronic die being attached to the other of the first microelectronic die and the second microelectronic die with the plurality of interconnects.

In Example 5, the subject matter of any of Examples 1-4 can optionally include the microelectronic substrate having a first surface proximate the first microelectronic die and a second surface proximate the second microelectronic die.

In Example 6, the subject matter of any of Examples 1-5 can optionally include an interconnect layer on at least one of the microelectronic substrate first surface and the microelectronic substrate second surface.

In Example 7, the subject matter of any of Examples 1-6 can optionally include an external interconnect on the interconnect layer.

In Example 8, the subject matter of any of Examples 1-7 can optionally include the microelectronic substrate comprising a first laminate layer and a second laminate layer.

In Example 9, the subject matter of Example 8 can optionally include an interface formed between the first laminate layer and the second laminate layer, and wherein the interface abuts one of the interface material, the first microelectronic die, and the second microelectronic die.

In Example 10, the subject matter of any of Examples 1-9 can optionally include at least one conductive via within the microelectronic substrate.

The following examples pertain to further embodiments, wherein Example 11 is a method of forming a microelectronic device, comprising attaching at least one first microelectronic die to a second microelectronic die with a plurality of interconnects; disposing an underfill material between the at least one first microelectronic die and the second microelectronic die after attachment; positioning a first laminate layer proximate the at least one first microelectronic die; positioning a second laminate layer proximate the second microelectronic die; and bringing pressure to bear on the first laminate layer and the second laminate layer to form a microelectronic substrate embedding the at least one first microelectronic die and the second microelectronic die therein.

In Example 12, the subject matter of Example 11 can optionally include disposing the underfill material between the at least one first microelectronic die and the second microelectronic die after attachment by capillary action.

In Example 13, the subject matter of any of Examples 11-12 can optionally include attaching an active surface at least one of the first microelectronic die and the second microelectronic die to the other of the first microelectronic die and the second microelectronic die with the plurality of interconnects.

In Example 14, the subject matter of any of Examples 11-13 can optionally include at least one through silicon via at a back surface of at least one of the first microelectronic die and the second microelectronic die to the other of the first microelectronic die and the second microelectronic die with the plurality of interconnects.

In Example 15, the subject matter of any of Examples 11-14 can optionally include bringing pressure to bear on the first laminate layer and the second laminate layer to form the microelectronic substrate having a first surface proximate the at least one first microelectronic die and a second surface proximate the second microelectronic die.

In Example 16, the subject matter of any of Examples 11-15 can optionally include forming an interconnect layer on at least one of the microelectronic substrate first surface and the microelectronic substrate second surface.

In Example 17, the subject matter of any of Examples 11-16 can optionally include forming an external interconnect on the interconnect layer.

In Example 18, the subject matter of any of Examples 11-17 can optionally include forming at least one conductive via within the microelectronic substrate.

The following examples pertain to further embodiments, wherein Example 19 is a method of forming a microelectronic device, comprising disposing an underfill material on the at least one of a first microelectronic die and the second microelectronic die; attaching at least one first microelectronic die to a second microelectronic die with a plurality of interconnects extending through the underfill material; positioning a first laminate layer proximate the at least one first microelectronic die; positioning a second laminate layer proximate the second microelectronic die; and bringing pressure to bear on the first laminate layer and the second laminate layer to form a microelectronic substrate embedding the at least one first microelectronic die and the second microelectronic die therein.

In Example 20, the subject matter of Example 19 can optionally include attaching an active surface at least one of the first microelectronic die and the second microelectronic die to the other of the first microelectronic die and the second microelectronic die with the plurality of interconnects.

In Example 21, the subject matter of any of Examples 19-20 can optionally include at least one through silicon via at a back surface of at least one of the first microelectronic die and the second microelectronic die to the other of the first microelectronic die and the second microelectronic die with the plurality of interconnects.

In Example 22, the subject matter of any of Examples 19-21 can optionally include bringing pressure to bear on the first laminate layer and the second laminate layer to form the microelectronic substrate having a first surface proximate the at least one first microelectronic die and a second surface proximate the second microelectronic die.

In Example 23, the subject matter of any of Examples 19-22 can optionally include forming an interconnect layer on at least one of the microelectronic substrate first surface and the microelectronic substrate second surface.

In Example 24, the subject matter of any of Examples 19-23 can optionally include forming an external interconnect on the interconnect layer.

In Example 25, the subject matter of any of Examples 19-24 can optionally include forming at least one conductive via within the microelectronic substrate.

It is understood that the subject matter of the present description is not necessarily limited to specific applications illustrated in FIGS. 1-10. The subject matter may be applied to other microelectronic device applications, as well as applications outside of the microelectronic industry, as will be understood to those skilled in the art.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:
1. A method of forming a microelectronic device, comprising:
attaching at least one first microelectronic die to a second microelectronic die with a plurality of interconnects;

disposing an underfill material between the at least one first microelectronic die and the second microelectronic die after attachment;

positioning a first laminate layer proximate the at least one first microelectronic die;

positioning a second laminate layer proximate the second microelectronic die; and bringing pressure to bear on the first laminate layer and the second laminate layer to form a microelectronic substrate embedding the at least one first microelectronic die and the second microelectronic die therein.

2. The method of claim 1, wherein disposing an underfill material between the at least one first microelectronic die and the second microelectronic die after attachment comprises disposing an underfill material between the at least one first microelectronic die and the second microelectronic die after attachment by capillary action.

3. The method of claim 1, wherein attaching at least one first microelectronic die to a second microelectronic die with a plurality of interconnects comprises attaching an active surface at least one of the first microelectronic die and the second microelectronic die to the other of the first microelectronic die and the second microelectronic die with the plurality of interconnects.

4. The method of claim 1, wherein attaching at least one first microelectronic die to a second microelectronic die with a plurality of interconnects comprises attaching at least one through silicon via at a back surface of at least one of the first microelectronic die and the second microelectronic die to the other of the first microelectronic die and the second microelectronic die with the plurality of interconnects.

5. The method of claim 1, wherein bringing pressure to bear on the first laminate layer and the second laminate layer to form the microelectronic substrate comprises bringing pressure to bear on the first laminate layer and the second laminate layer to form the microelectronic substrate having a first surface proximate the at least one first microelectronic die and a second surface proximate the second microelectronic die.

6. The method of claim 5, further comprising forming an interconnect layer on at least one of the microelectronic substrate first surface and the microelectronic substrate second surface.

7. The method of claim 6, further comprising forming an external interconnect on the interconnect layer.

8. The method of claim 1, further comprising forming at least one conductive via within the microelectronic substrate.

9. A method of forming a microelectronic device, comprising:

disposing an underfill material on at least one of a first microelectronic die and a second microelectronic die;

attaching the at least one first microelectronic die to the second microelectronic die with a plurality of interconnects extending though the underfill material;

positioning a first laminate layer proximate the at least one first microelectronic die;

positioning a second laminate layer proximate the second microelectronic die; and bringing pressure to bear on the first laminate layer and the second laminate layer to form a microelectronic substrate embedding the at least one first microelectronic die and the second microelectronic die therein.

10. The method of claim 9, wherein attaching at least one first microelectronic die to a second microelectronic die with a plurality of interconnects comprises attaching an active surface at least one of the first microelectronic die and the second microelectronic die to the other of the first microelectronic die and the second microelectronic die with the plurality of interconnects.

11. The method of claim 9, wherein attaching at least one first microelectronic die to a second microelectronic die with a plurality of interconnects comprises attaching at least one through silicon via at a back surface of at least one of the first microelectronic die and the second microelectronic die to the other of the first microelectronic die and the second microelectronic die with the plurality of interconnects.

12. The method of claim 9, wherein bringing pressure to bear on the first laminate layer and the second laminate layer to form the microelectronic substrate comprises bringing pressure to bear on the first laminate layer and the second laminate layer to form the microelectronic substrate having a first surface proximate the at least one first microelectronic die and a second surface proximate the second microelectronic die.

13. The method of claim 12, further comprising forming an interconnect layer on at least one of the microelectronic substrate first surface and the microelectronic substrate second surface.

14. The method of claim 13, further comprising forming an external interconnect on the interconnect layer.

15. The method of claim 9, further comprising forming at least one conductive via within the microelectronic substrate.

16. The method of claim 1, wherein a portion of the first laminate layer contacts the second laminate layer forming an interface layer.

17. The method of claim 16, wherein the interface abuts one of the underfill material, the first microelectronic die, and the second microelectronic die.

18. The method of claim 9, wherein a portion of the first laminate layer contacts the second laminate layer forming an interface layer.

19. The method of claim 18, wherein the interface abuts one of the underfill material, the first microelectronic die, and the second microelectronic die.

* * * * *